(12) United States Patent
Fujimura et al.

(10) Patent No.: US 7,914,954 B2
(45) Date of Patent: Mar. 29, 2011

(54) STENCIL, STENCIL DESIGN SYSTEM AND METHOD FOR CELL PROJECTION PARTICLE BEAM LITHOGRAPHY

(75) Inventors: Akira Fujimura, Saratoga, CA (US);
Takashi Mitsuhashi, Kanagawa (JP);
Katsuo Komuro, Chiba (JP)

(73) Assignee: D2S, Inc., San Jose, CA (US)

( * ) Notice: Subject to any disclaimer, the term of this patent is extended or adjusted under 35 U.S.C. 154(b) by 291 days.

(21) Appl. No.: 12/207,342

(22) Filed: Sep. 9, 2008

(65) Prior Publication Data
US 2010/0062349 A1 Mar. 11, 2010

(51) Int. Cl.
*G03F 9/00* (2006.01)
*G03C 5/00* (2006.01)
(52) U.S. Cl. .............................. 430/5; 430/296; 430/942
(58) Field of Classification Search .............. 430/5, 296, 430/942
See application file for complete search history.

(56) References Cited

U.S. PATENT DOCUMENTS

| | | | |
|---|---|---|---|
| 5,424,173 A | 6/1995 | Wakabayashi et al. | |
| 5,866,913 A | 2/1999 | Robinson | |
| 6,087,052 A | 7/2000 | Manabe et al. | |
| 6,586,341 B2 * | 7/2003 | Moniwa et al. | 438/717 |
| 6,677,089 B2 | 1/2004 | Ogino et al. | |
| 6,732,351 B2 * | 5/2004 | Yamashita | 716/19 |
| 2002/0175298 A1 | 11/2002 | Moniwa et al. | |

FOREIGN PATENT DOCUMENTS

| | | |
|---|---|---|
| JP | 2003-115429 A | 4/2003 |
| KR | 10-2002-0096364 A | 12/2002 |
| KR | 10-0437542 B1 | 6/2004 |

OTHER PUBLICATIONS

International Search Report of the International Searching Authority mailed Feb. 12, 2010, PCT application No. PCT/UC2009/051606 filed on Jul. 23, 2009.
U.S. Appl. No. 11/226,253, Lapanik et al., filed Sep. 15, 2005, entitled "Method and system for stencil design for particle beam writing".
M. David Levenson, "Intel Promotes Computational Lithography Capabilities," SolidState Technology, Jun. 2007, 2 pgs, http://www.solid-state.com/display_article/296344/5/WNART/none/UPFRN/Intel-promotes...., viewed Aug. 7, 2008.
Harry J. Levinson et al., "Optical Microlithography XXI,"SPIE, Proceedings vol. 6924, Mar. 7, 2008, http://spie.org/x648.xml?product_id=773248, viewed Aug. 7, 2008.
Harry J. Levinson et al., "Optical Microlithography XXI,"SPIE, Proceedings vol. 6924, Mar. 7, 2008, http://spie.org/x648.xml?product_id=772955, viewed Aug. 7, 2008.

* cited by examiner

*Primary Examiner* — Christopher G Young
(74) *Attorney, Agent, or Firm* — The Mueller Law Office, P.C.

(57) ABSTRACT

Stencil masks, particle beam lithography characters and methods for designing the same for use in particle beam lithography are disclosed. The masks, characters and methods for designing them allows for more accurately writing images by reducing various chemical and physical effects, particularly Coulomb and proximity effects. Particle current reaching a surface is reduced by introducing shield areas, which preserve the shape and fidelity of the written image. The shape of the written image is further corrected by systematically adjusting the shape of the character or mask.

21 Claims, 16 Drawing Sheets

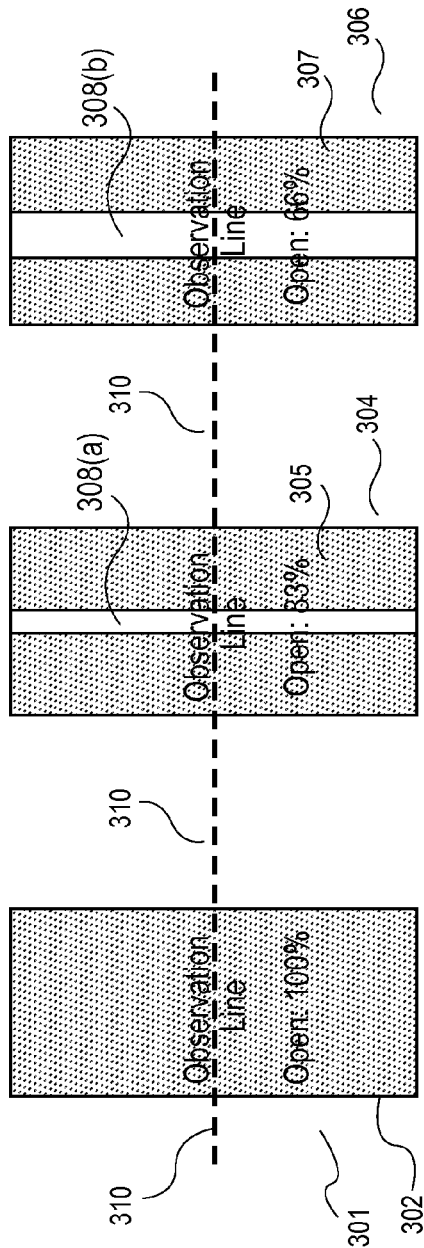
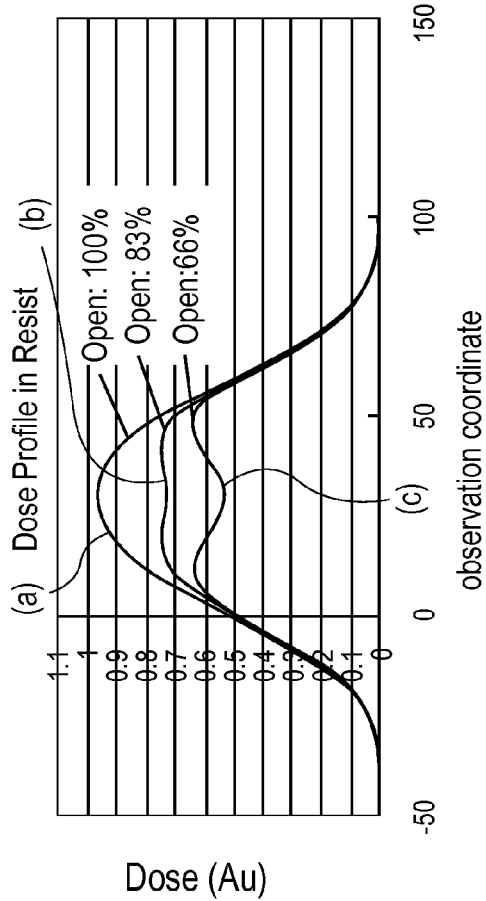
FIG. 3A  FIG. 3B  FIG. 3C  FIG. 3D

SPACE d: 0nm

SPACE d: 10nm

SPACE d: 14nm

SPACE d: 20nm

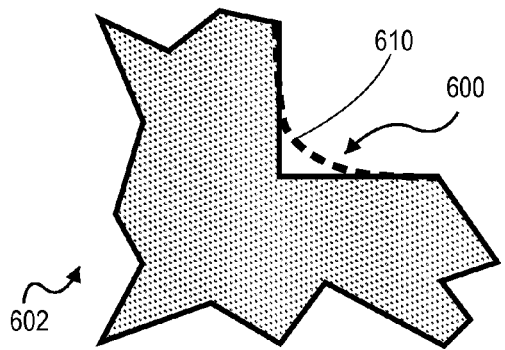
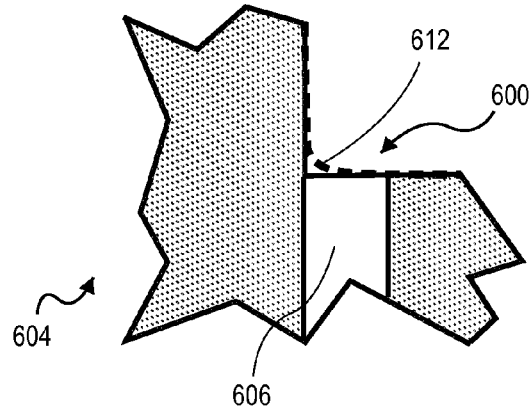
FIG. 6A  FIG. 6B
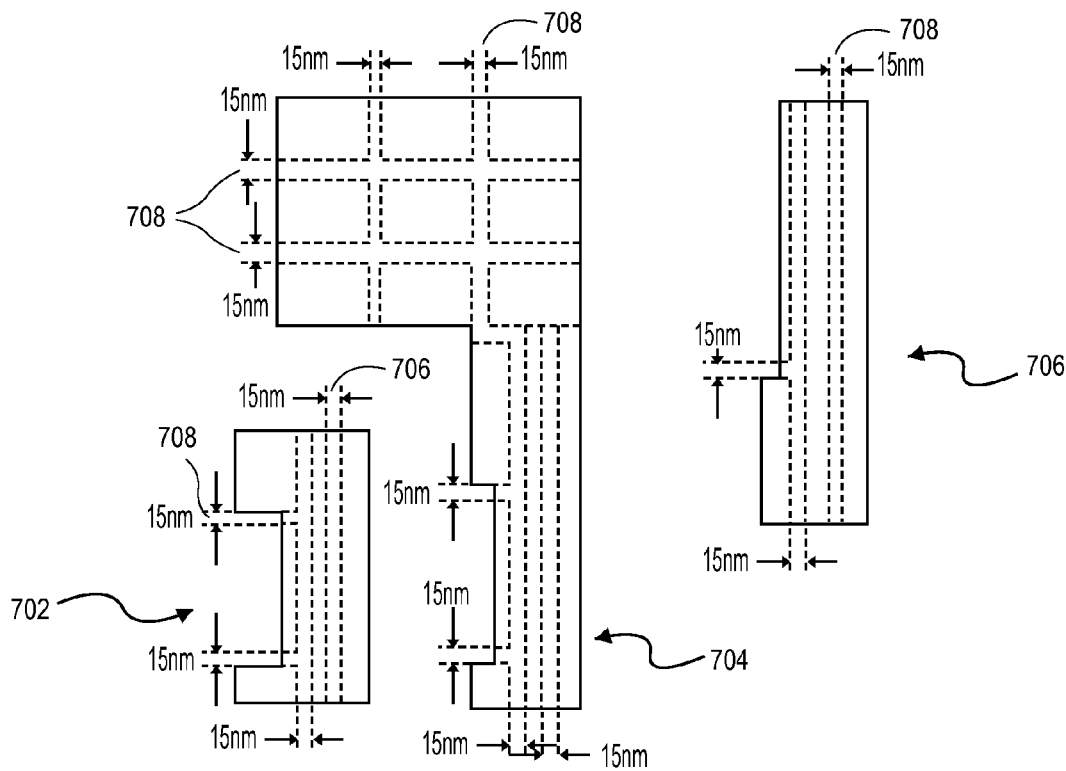
FIG. 7

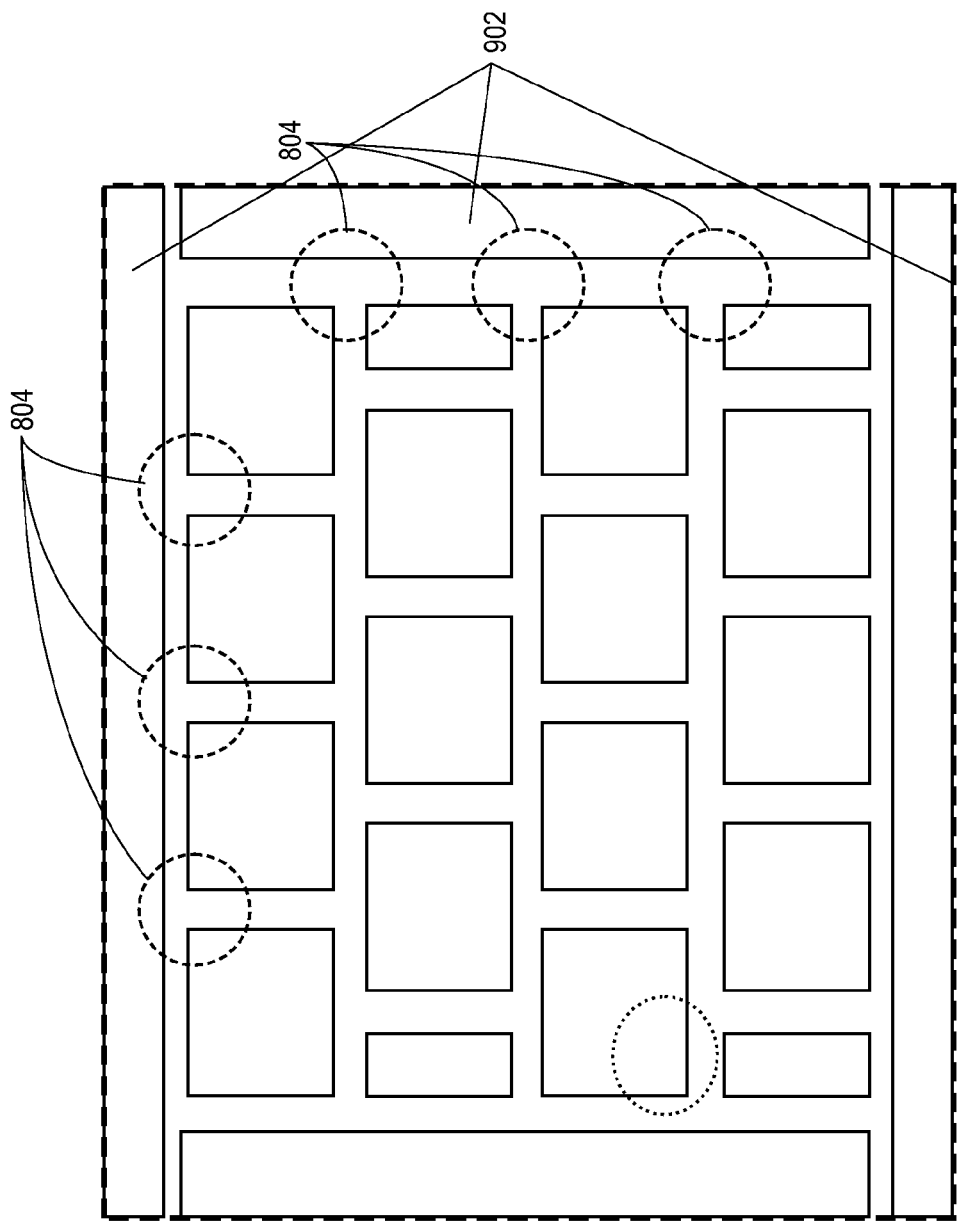

STENCIL, STENCIL DESIGN SYSTEM AND METHOD FOR CELL PROJECTION PARTICLE BEAM LITHOGRAPHY

BACKGROUND OF THE INVENTION

A particle beam or ebeam writer uses one or more beams of particles (typically electrons, but other particles may be used) to generate a given pattern on a plate. The plate is covered with a particle sensitive material. By way of example, consider the case of an electron beam writing (EBW) technology. The EBW technology uses an electron beam to generate various patterns on a surface. A surface may be a reticle, a photomask, a stencil mask, a wafer, a fabric, a glass, a plastic, an LCD panel or any other surface.

One use of EBW technology is in writing a reticle or a photomask in optical lithography. Light shines through the reticle in a stepper, a wafer writing machine, to write a substrate such as a silicon wafer, or a fabric, a glass, a plastic, an LCD panel or any other substrate. A fundamental problem with optical lithography is the image quality degradation and the resolution limits caused by optical proximity effect. One method to overcome this problem is using electron beam (ebeam) direct writing (EBDW) technology, a variation of the EBW technology. In EBDW technology, EBDW technology is used to write a substrate directly in lieu of the stepper. The theoretical resolution of an electron beam is finer, which allows writing denser layouts than with optical lithography. However, this technology has a lower throughput.

Several methods have been conventionally used to increase the throughput of using EBW. One such method is based on a variable shape beam (VSB) technology, which facilitates writing patterns by using particle beam shots of fixed and simple shapes with variable size. Generally, an electron beam is shone through a shaping aperture (usually square). The beam exiting the shaping aperture is deflected by a deflector through one of a number of simple shape stencils. A demagnifying lens then reduces the shaped beam onto the target wafer. Using a combination of the simple stencil shapes or one or more portions of the simple stencil shapes, the desired patterns are written to the surface. By way of example, the simple stencil shapes include rectangles and triangles. Further, the VSB-type EBW performs proximity effect correction by dose control, shape biasing and minute fracturing. However, such manipulations increase writing time. Variable shape beam writing is well known in the art.

Another conventional method used for IC fabrication is cell projection (CP) technology, which is also referred to as character projection or block exposure. Like VSB writing, character projection technology directs an ebeam through a first shaping aperture and deflects the first shaped beam to a stencil. Another character projection technology may deflect an ebeam to a first shaping aperture and direct the first shaped beam to a stencil. Yet another character projection technology may use other than two apertures. In any case at least one of the apertures would contain a character of complex shapes in character projection, thereby enabling writing complicated patterns by one exposure shot. As a result, the overall exposure time is decreased. In addition, the writing system throughput increases. However, the technique is limited by several restrictions pertaining to the geometric sizes and kind of figures that can be exposed. In addition, the proximity effect correction becomes a very challenging task. The Coulomb effect also introduces difficulties in the use of charged particle beam writers by blurring the image written by the particle beam writer, thus reducing the accuracy of the writing.

Coulomb's Law tells us that oppositely charged particles will be attracted to each other and that like charged particles will repel each other. In the case of an EBW, the negatively charged electrons repel each other. By the time the electron beam reaches the writing surface the electrons will be more dispersed than when they started, thus creating a "blurred" image. This effect is called the Coulomb effect. The amount of the blurring, in size δ, is given by the formula $$\delta \propto \frac{I}{V^{\frac{3}{2}}} \quad (1)$$

where I is the beam current and V is the acceleration voltage. A similar effect occurs with positively charged particles.

In order to write finely detailed patterns with an ebeam writer, it is necessary to reduce the amount of blur caused by the Coulomb effect. Considering the above equation, in order to minimize the blur size δ, one needs to reduce the current I, and/or increase the voltage V. However, reducing current and/or increasing voltage cause other difficulties. Higher voltage results in increased back-scattering, which reduces the fidelity of the written design image. Reducing current is undesirable as it increases the exposure time which means the design will take longer to write using the electron beam. Thus we would like to find a way to design cells that reduces blurring, without also increasing backscattering or increasing exposure time.

With cell projection technology, the beam current is proportional to the open aperture dimensions of the cell. As discussed above, the lower the beam current, the less blurring occurs as a result of the Coulomb effect. At the same time, lowering the current will increase the required exposure time.

In order to write the image in the surface of the resist, a certain amount of energy must be transferred from the electrons into the material of the resist layer. The amount of energy transferred is the dose amount. A design must have higher dose amount than a threshold value determined by the resist so that the image is successfully written on the resist, but not so much that too much is written outside of the design area because of scattering effects such as forward scattering in the resist, and backscattering from the material under the resist. The design must also take into consideration the amount of energy deposited in neighboring patterns which could spill over into the design area due to these scattering effects. Adjusting for the amount of charge in order to achieve the correct dose is called dose correction.

Though other systems and methods for reducing the amount of electrons have been proposed, such as attaching mesh structures to the stencil mask, such systems introduce an extra cost in the manufacturing step. Furthermore, mesh structures may overheat and therefore may not be practical. To the inventors' knowledge a production EBW machine that has utilized such a system has not been made.

In light of the foregoing discussion, a need exists for a method and system that improves the throughput of EBW technology and simultaneously maintains high accuracy using the CP system. Thus, a design technology for making characters that reduce maximally Coulomb and proximity effects while maintaining thermal, structural, line edge roughness, and other design considerations within acceptable limits is desired. Such optimization of the balance of different effects need to be differently applied for each character or within different parts of the same character to maximize the reduction of the effects of Coulomb and proximity effects. The present invention addresses such a need.

SUMMARY OF THE INVENTION

Embodiments of the present invention provide a stencil mask for particle beam lithography. One embodiment comprises an aperture in the stencil, where the aperture defines a perimeter of an image shape that is desired on a surface. The aperture has multiple open areas, and a shield area that occupies, at least in part, an interstitial area between the open areas. Another embodiment provides a mesh adjacent to the stencil mask. Embodiments may comprise any shape of open areas, including without limitation rectilinear arrangement (e.g., square, rectangle, penta- or hexagonal), or any curvilinear shape. The shield areas may intersect in a T-configuration, that is where three shield areas in the interstitial area meet to form an approximate T-configuration. Alternatively, three shield areas may meet at any non-right angle configuration at the apex of a polygonal opening, or alternatively greater than four sided polygons can meet at the apexes of the polygons. A guard aperture may also be provided along or within the perimeter of the aperture, which serves the function of guarding against under exposure in the regions where the shields intersect the boundary or the perimeter of the aperture.

The present invention also includes embodiments for a character for projecting a desired image onto a surface using a charged particle beam, the character being one of many characters in accordance with embodiments of the present invention located in a stencil mask. An embodiment of the character comprises a shape to approximately achieve the desired image, where the shape has one or more blocking members. The blocking members reduce charged particle beam current from passing through the shape while permitting sufficient charged particle beam current through the shape to project the desired image onto the surface, thereby reducing Coulomb and proximity effects. In alternative embodiments at least one decoration is provided on at least one apex of the shape to achieve a higher fidelity at the apex of the projected image. The blocking members can take on any number of configurations, one example of which are blocking stripes. The stripes can be laid out in an approximate polygonal configuration. The polygonal configuration can be any polygon, e.g., square, rectangle, penta- or hexagonal. Additionally, the polygons may be offset. For example for squares or rectangles the intersections of the configuration form an approximate T-shape, and when aligned the intersections form a cross-shape. In additional embodiments, the polygonal configuration of blocking members can be bounded by open bars, thereby providing sufficient beam energy where the stripes terminate at a boundary of the shape. In various embodiments of the present invention, the blocking members occupy approximately 10 percent to approximately 45 percent of said shape or preferably 15 to 40 percent (most preferably 20-25%), the remaining portion of the shape comprising open areas through which beam current may pass. Additionally, the blocking areas may comprise any shape, including without limitation rectilinear (e.g., square, rectangle, penta- or hexagonal), or any curvilinear shape.

Embodiments of the present invention may also include methods of direct writing a desired image using a charged particle beam. These methods may include providing one or more characters in a stencil mask, where the character has a shape to approximately achieve the desired image, and where the shape has one or more blocking members. The blocking members reduce beam current passing through the shape. The charged particle beam is passed through the shape, where the blocking members partially block current from the charged particle beam while permitting sufficient beam current through the shape to project the approximate desired image onto the surface, whereby blocking part of the charged particle beam reduces Coulomb and proximity effects. In alternative embodiments a mesh may be provided adjacent to at least a portion of the character. A decoration may also be provided approximately at a point where the blocking member intersects a boundary of the character. The blocking areas may comprise any shape, including without limitation rectilinear (e.g., square, rectangle, penta- or hexagonal), or any curvilinear shape.

Embodiments of the present invention may also include methods for designing a stencil mask for particle beam lithography. These methods may include the steps of loading a character shape (e.g. into memory), where a perimeter of the shape defines an outline for a desired pattern; determining shielding members; generating a modified character shape using the shielding members, where the shielding members are capable of blocking radiation from passing through said modified character shape. The determining and generating steps may be repeated as necessary to generate a sufficient number of different modified character shapes to create the stencil mask. Embodiments of these methods may also include coupling the stencil mask to a mesh. Other embodiments of these methods may include the further steps of defining a plurality of observation points within the desired pattern and along a boundary of said desired pattern; calculating a deposition energy at the observation points; determining one or more regions where the deposition energy exceeds a predefined energy value; and configuring the shielding members for the one or more regions, where the shielding members reduce the deposition energy within and around the one or more regions. Further embodiments of these methods may include the additional steps of obtaining a theoretical latent image based on the character shape; if the theoretical latent image does not have satisfactory fidelity, re-configuring at least one re configured shielding member; and re-modifying the character shape to include the at least one re-configured shielding member to achieve a re-modified character shape. Even further additional steps may include defining at least one connecting member, where the at least one connecting member connects the at least one re-configured shielding member to the perimeter of the character shape, thereby providing structural support to the at least one shielding member, and blocking additional radiation from passing through the stencil mask. Any or all of these steps may be repeated until the re-modified character shape achieves a theoretical latent image that has a predetermined fidelity or acceptance criteria.

BRIEF DESCRIPTION OF DRAWINGS

FIG. 3 depicts changing the shape of a character in accordance with an embodiment of the present invention;

FIG. 6 depicts another embodiment of the present invention for modifying the shape of a direct write character and the latent image obtained therefrom;

FIG. 7 depicts several possible modified character shapes in accordance with an embodiment of the present invention;

FIG. 9 depicts a further configuration for laying out blocking members and providing open guard bars in accordance with embodiments of the present invention;

DETAILED DESCRIPTION

Figure 1:
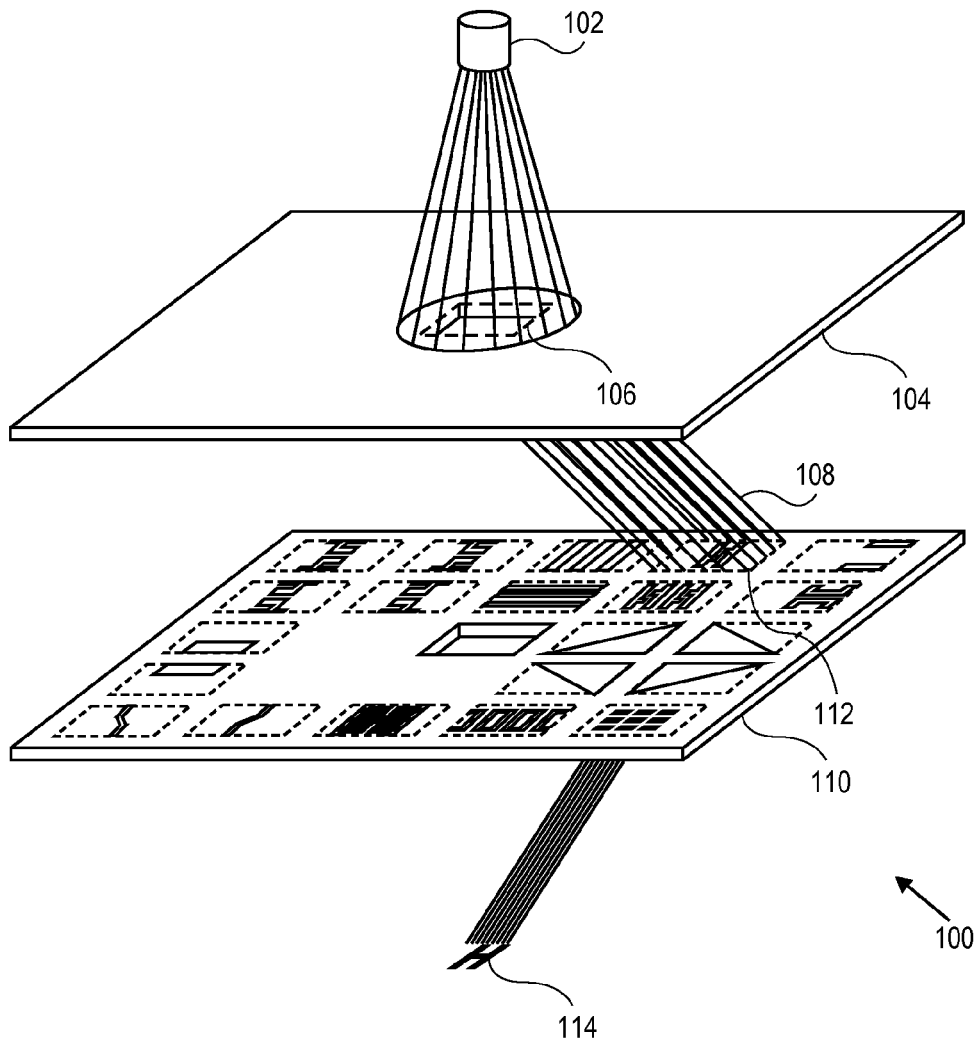
FIG. 1 depicts a cell projection type particle beam writing device in accordance with the prior art.

FIG. 1 illustrates an example of a character projection particle beam writing device 100 in accordance with the prior art, upon which various embodiments of the present invention can be practiced. It is to be noted that the electron beam writing device has been shown for the purpose of illustration only. The embodiments of the invention are applicable to any particle beam writing device such as an ion beam writing device. Further, the embodiments of the present invention are applicable not only to wafer writing devices, but also to pattern writing devices, by way of example, a mask writing machine. Ebeam writing device 100 includes an electron gun 102, first shaping aperture plate 104, first shaping aperture (rectangular in this example) 106, and second shaping aperture plate 110 that contains multiple characters 112. Other machines may have only one shaping aperture, or may customize both the first aperture and the second aperture to generate characters, or may have the first aperture project the characters through a stencil mask at the first aperture. Yet other machines may have other than two apertures. The present invention is applicable to any machine where character projection is used.

Electron gun 102 emits electrons. These electrons pass through first shaping aperture 106 of first shaping aperture plate 104, after which the electrons are transferred as rectangular-shaped beam 108, in the present example. A deflector (not shown) between the first and second aperture plates 104, 110 deflects beam 108 through characters 112, placed on second shaping aperture plate 110. The beam going through characters 112 (one at any one time, as will be appreciated) passes through a demagnifying lens (not shown) to reduce the size of the character 114 ultimately imaged on the wafer (or any other lithographic surface). For example, beam 108 is deflected through character 112, the beam exiting character 112 passes through the demagnifying lens (not shown) and character 112 is ultimately imaged as demagnified character 114 on the surface, other target, or surface. In this example the imaged demagnified character 114 has the shape of an "H", but the character shape is a matter of choice left to the practitioner.

Figure 2:
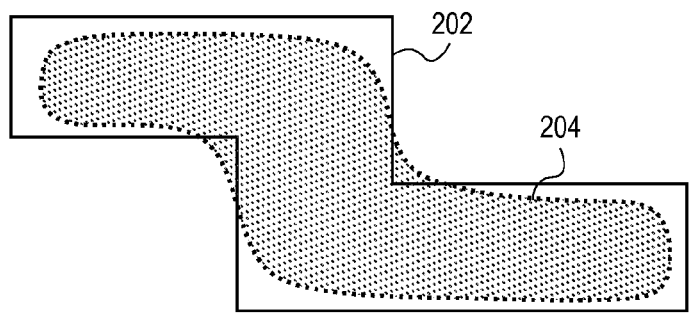
FIG. 2 depicts a desired image intended by a character and a corresponding actually obtained image.

FIG. 2 shows an example of a difference between an intended image 202 and an obtained image 204. The obtained image 204 has a loss of fidelity from the intended image 202 because of, for example and without limitation, proximity and/or Coulomb effect or the resolution precision of the resist. Degradation of image fidelity that occurs in the writing is caused by physical and chemical processes of the lithography. Correcting the shape of the aperture of character 112 in the stencil, in accordance with embodiments of the present invention, will aid in reducing the differences between the intended image 202 and the obtained image 204.

An issue that degrades image fidelity of lithography by EBW is proximity effect by scattering and back scattering of electrons in the resist and from a material in a structure in the resist. Several technologies for correction of proximity effect are reported. An issue that is different from proximity effect but degrades the fidelity of lithography image is Coulomb effect, which is described above.

FIG. 3 depicts an example character design, in accordance with an embodiment of the present invention, which reduces beam current and minimizes image blur by the Coulomb effect. FIG. 3A is an example of a rectangular character 301 having a character opening 302 in accordance with the prior art for writing a rectangular image. The shape and outline of character 301 is similar to the image that is to be written. FIGS. 3B and 3C are examples of characters in accordance with an embodiment of the present invention. FIGS. 3B and 3C depict rectangular characters 304, and 306 having an outline of the same approximate dimension as rectangular character 301. However, in accordance with an embodiment of the present invention, character openings 305 and 307 have a different shape than that of character opening 302, yet they both have the same outline and same desired image dimensions. In particular character openings 305 and 307 have blocking stripes 308(*a*) and 308(*b*) respectively. Blocking stripes 308(*a*) and 308(*b*) are opaque and block electrons from reaching the surface. Blocking stripes 308(*a*) and 308(*b*) change the shape of character openings 305 and 307, and by virtue of the different widths of the blocking stripes they change the shape by decreasing the open area by different amounts.

FIG. 3D shows a deposition energy profile of charged particles for character openings 302, 305 and 307 of the rectangular characters 301, 304, and 306. FIG. 3D plots the dose or deposition energy versus the observation coordinate along observation line 310. Plot (a) is for prior art character opening shape 302 having no stripes, or 100% open. Plots (b) and (c), respectively, show the results for character opening shapes 305 and 307, in accordance with embodiments of the present invention, having 83% and 66% opening, respectively. In the present example, deposition energy or dose amount is tuned to a level that generates latent image at larger than 0.5. In other words, the deposition energy is tuned to 0.5 at the boundary of the writing pattern. What FIG. 3 demonstrates is that changing the shape of the character opening, in accordance with embodiments of the present invention, results in the ability to reduce the cumulative dose while still achieving the required dose to expose the desired character shape. Therefore, embodiments of the present invention reduce proximity and Coulomb effects without the appreciable loss of fidelity in the projected character.

Figure 4A:
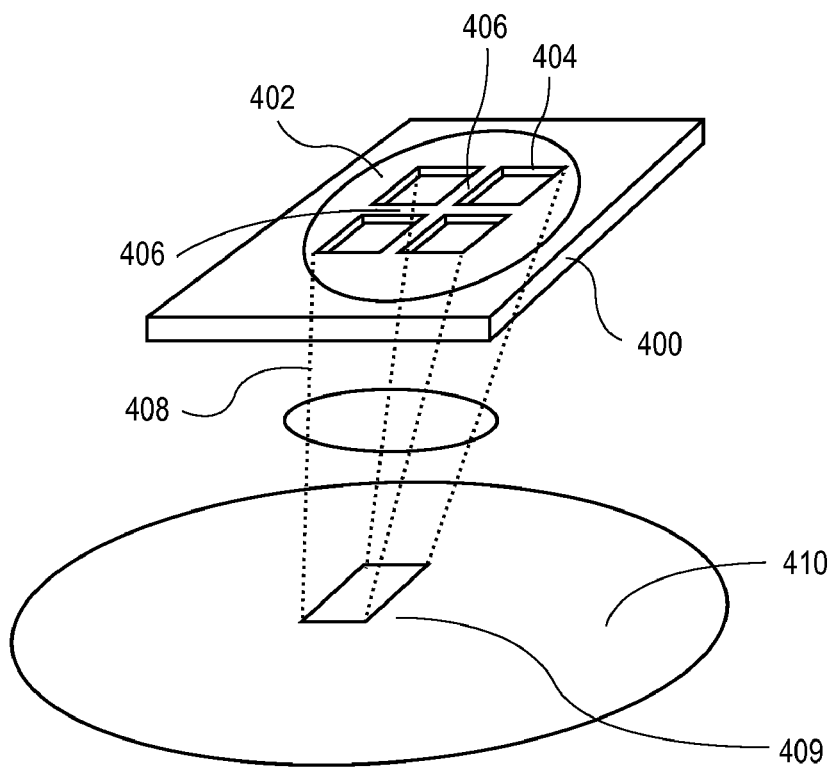
FIG. 4 depicts an example of rectangular character with a modified shape for writing a rectangular image in accordance with an embodiment of the invention.
Figure 4B:
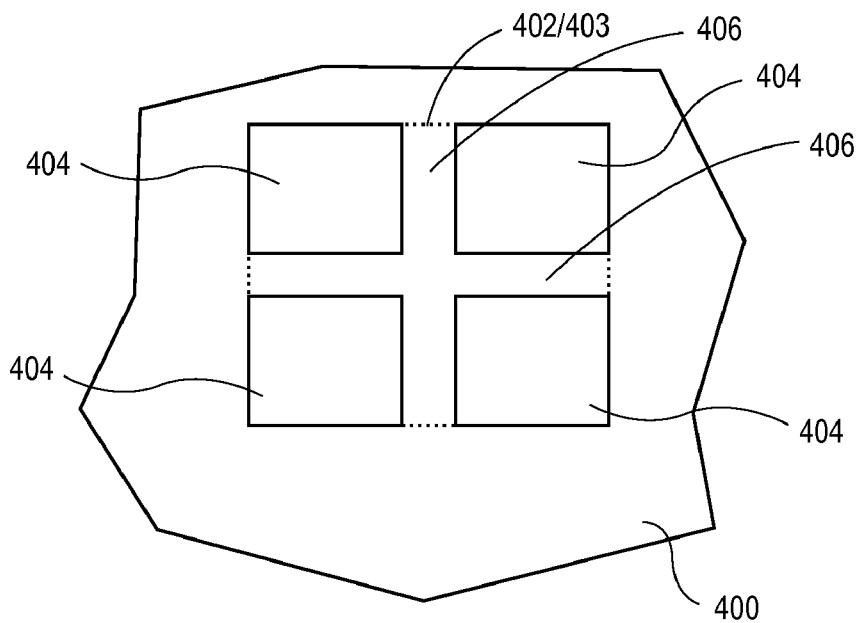
Figure 5A:
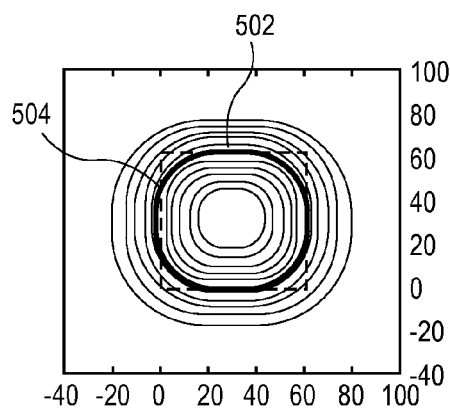
FIG. 5 depicts contour lines for images projected using a rectangular character with a modified shape in accordance with an embodiment of the invention.
Figure 5B:
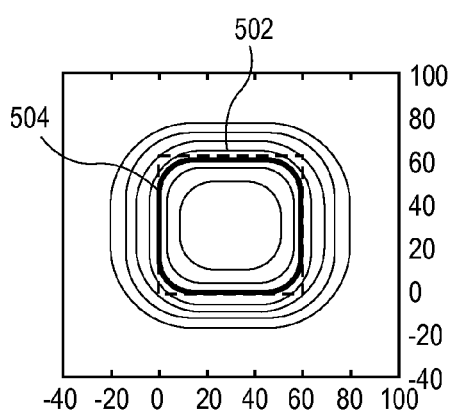
Figure 5C:
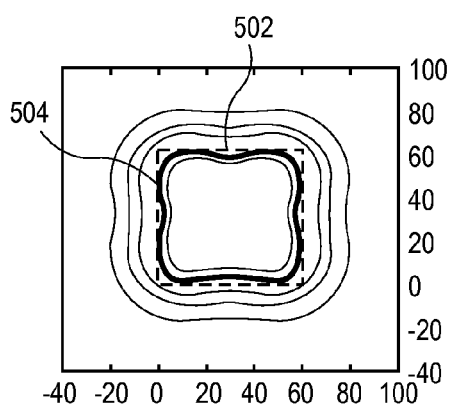
Figure 5D:
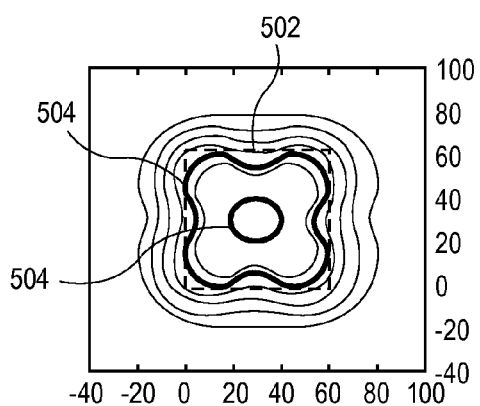

FIGS. 4A-B depicts an example of writing rectangle patterns in accordance with an embodiment of the present invention. Stencil 400 comprises rectangular character 402 that has a shape comprised of four openings 404 separated by two stripes 406. Particle beam 408 passes through rectangular character 402 and generates rectangular image 409 on resist coated wafer 410. In accordance with an embodiment of the present invention, the Coulomb and proximity effects can be reduced while obtaining image 409 with acceptable fidelity.

FIG. 4B shows a top view of character 402 with a character outline 403. Stripes 406 form a cross shape, each stripe 406 having a width d that modifies the shape of the W×H character 402, outline 403 remains the same. Character 402 comprises four openings 404. Beam current passing through character 402 can be reduced by increasing width "d" of stripes 406. However, increasing the width d too much will decrease the deposition energy such that energy transmitted through openings 404 is insufficient to resolve the entire W×H character, and the unresolved portion of character 402 remains towards the center of the image of the character on the surface, as described below.

FIG. 5 depicts contour lines of theoretical latent images obtained on a surface using a 60 nm×60 nm rectangle character. The dark shaded contour lines 502 show the boundary at which sufficient exposure of the resist has taken place to develop the resist. The dotted rectangle line 504 depicts the desired image or image outline from the character, in the present example 60 nm×60 nm. FIG. 5(a) is a plot of the prior art where the shape of the character is not modified by stripes 406. FIGS. 5(b)-(d) are plots of the image of the character obtained using stripes in accordance with an embodiment of the present invention and varying width d of the stripe. In FIG. 5(b)-(c), with d equal to 10 and 14 nm (approximately 30% and 41% blocked) respectively, it was observed that the desired image was achieved with acceptable fidelity, but with a desired reduction of energy reaching the surface. In FIG. 5(d), with d equal to 20 nm (approximately 55.6% blocked), it was observed that insufficient energy reached the surface to resolve the center portion of the desired rectangle, and that the fidelity along the outside edges was not acceptable. FIG. 5 shows high image fidelity for d equal to 10 nm and or 14 nm compared with the prior art character that has no alteration of the character shape. In addition, changing the character shape in accordance with the present invention reduced beam currents to 70% and 59% (for d equal to 10 and 14 nm respectively) of the prior art character. It is important to note that the present invention achieved the reduction in beam current without an appreciable loss of fidelity. The reduction of beam current leads to reductions of the proximity and Coulomb effects, which is highly desirable.

FIG. 6 shows a schematic of a portion of a character for imaging apex 600 of a polygon. In particular FIG. 6A shows a cut-away of a character 602 according to the prior art, and FIG. 6B shows a cut-away of a character 604 whose shape has been modified by stripe 606 in accordance with an embodiment of the present invention. The solid lines at apex 600 in both FIGS. 6A and 6B depict the desired shape of the image at the apex, and the dotted lines depict the achieved image. It will be appreciated that the remainder of the character outside of apex 600 has been removed for the purpose of clarifying the discussion. In the prior art example of FIG. 6A concave vertex portion 600 of character 602 results in an undesirable image boundary 610, believed to be generated at least in part by proximity and Coulomb effects. The shape of character 604 has been modified, in accordance with an embodiment of the present invention, by the addition of stripe 606, resulting in improved image boundary 612. As depicted in FIG. 6B, stripe 606 enhances the fidelity of the image. It is believed that stripe 606 reduces proximity and Coulomb effects, thereby leading to a higher fidelity image of the character.

FIG. 7 shows several character shapes 702, 704, and 706 that can be used in EBW in accordance with embodiments of the present invention. Each of the character shapes depicted has 15 nm stripes 708 modifying the character shape. Stripes 708 are arranged to reduce Coulomb and proximity effects and increase the fidelity of the image. Stripes 708 are placed at the concave corners of the characters and strategically within the bulk of the character in order to achieve the desired image while reducing the amount of particles going through the character opening.

Figure 8A:
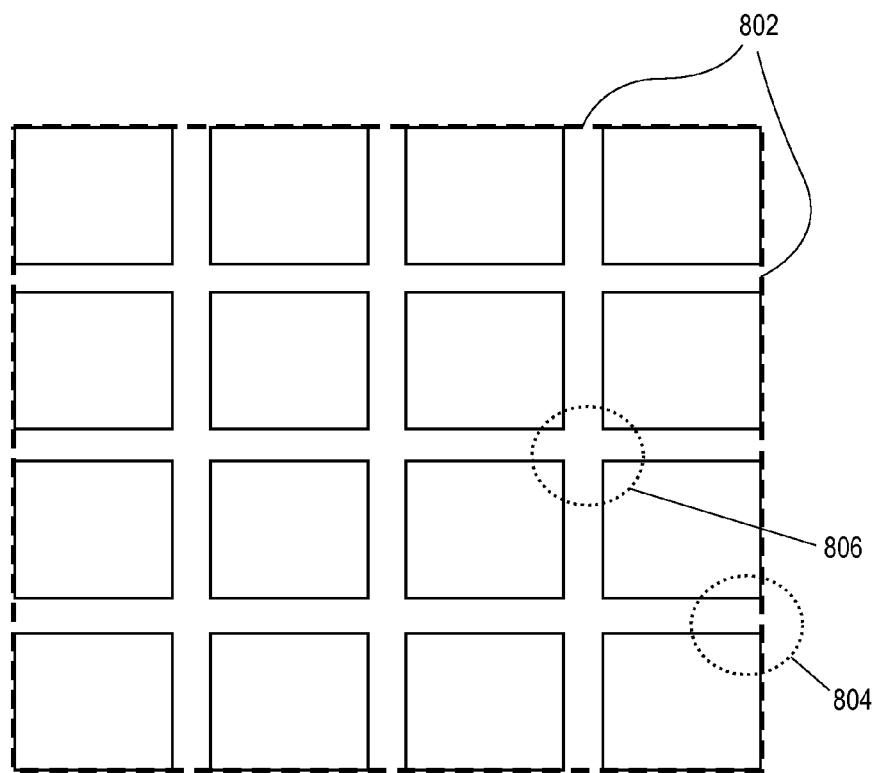
FIG. 8 depicts two different configurations for laying out blocking members in accordance with embodiments of the present invention.
Figure 8B:
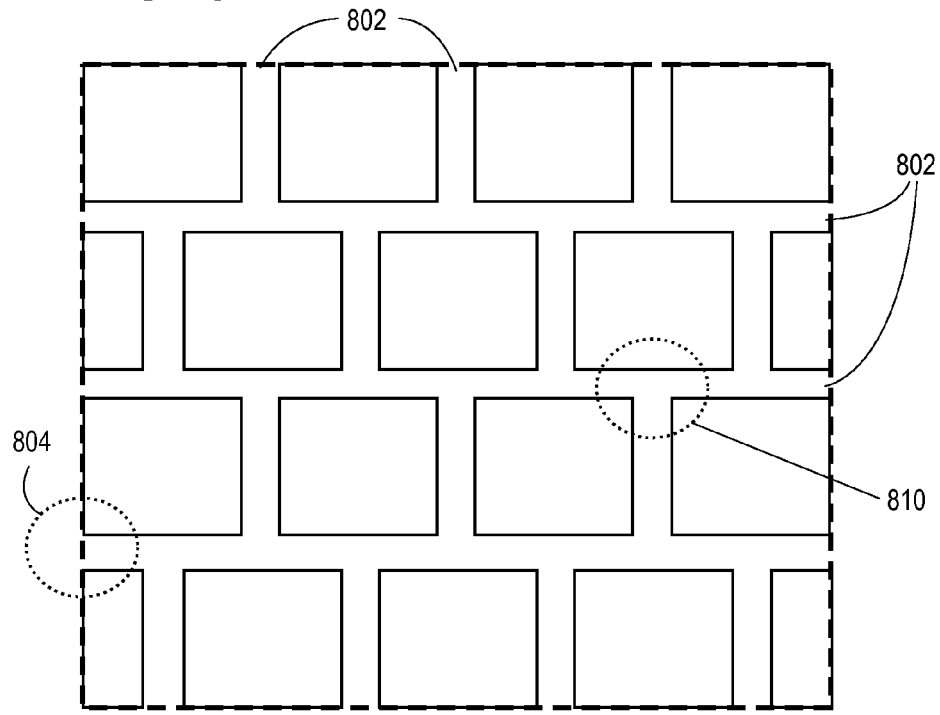

FIGS. 8-10 depict alternative embodiments to alter the shape of a character and achieve a higher fidelity of the desired image on the wafer or surface. FIG. 8A shows stripes 802 arranged in a straight grid pattern, as has been previously discussed. FIG. 8B shows stripes 802 arranged in an offset, T-pattern. Both of these embodiments have external openings 804 where less exposure would take place. Stripes 802 of FIG. 8A have a four way crossing 806 and stripes 802 of FIG. 8B have a three-way or T-crossing 810. Such differences in shielding at the intersections of the stripes changes the uniformity of energy that reaches the wafer or surface. In the four-way crossing case 806 energy reaching the surface will be lower at the center of the crossing point than that in the three-way crossing 810 as shown in FIG. 8B. Use of the four-way crossing can create exposure problems in the vicinity of the crossing because a lower density of energy reaches the surface at this point. The three-way or T-crossing does not share this same issue, and, therefore, is preferred over the four-way crossing.

FIG. 9 depicts a further embodiment of the present invention. External openings 804 of both the T- and cross-configurations, shown in FIG. 8, result in the boundary of the written image being set back because of a lack of deposition energy in this region, as the beam source in this region is blocked. An alternative embodiment of the present invention, shown in FIG. 9, provides open bar 902 to provide an open area adjacent to external openings 804, thereby providing a beam source to reduce or eliminate the potential image set back likely caused by external openings 804. Open bar 902 guards against the image set back. Open bar 902 also has the benefit of reducing line edge roughness (LER). Reduction of LER, or making a line boundary of a pattern as straight as possible, is an important factor when doing EBW.

Figure 10A:
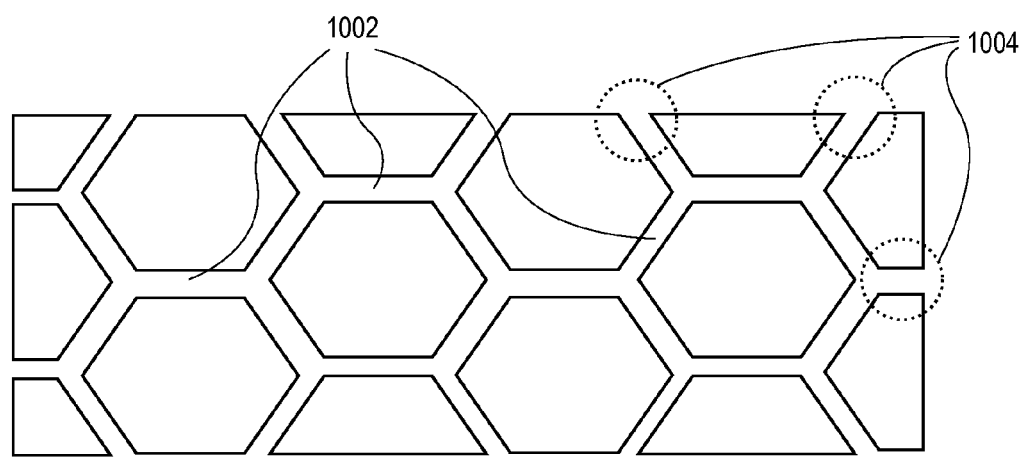
FIG. 10 depicts a further configuration for laying out blocking members and providing open guard bars in accordance with embodiments of the present invention, it also depicts alternative curvilinear and rectilinear configurations for laying out blocking members.
Figure 10B:
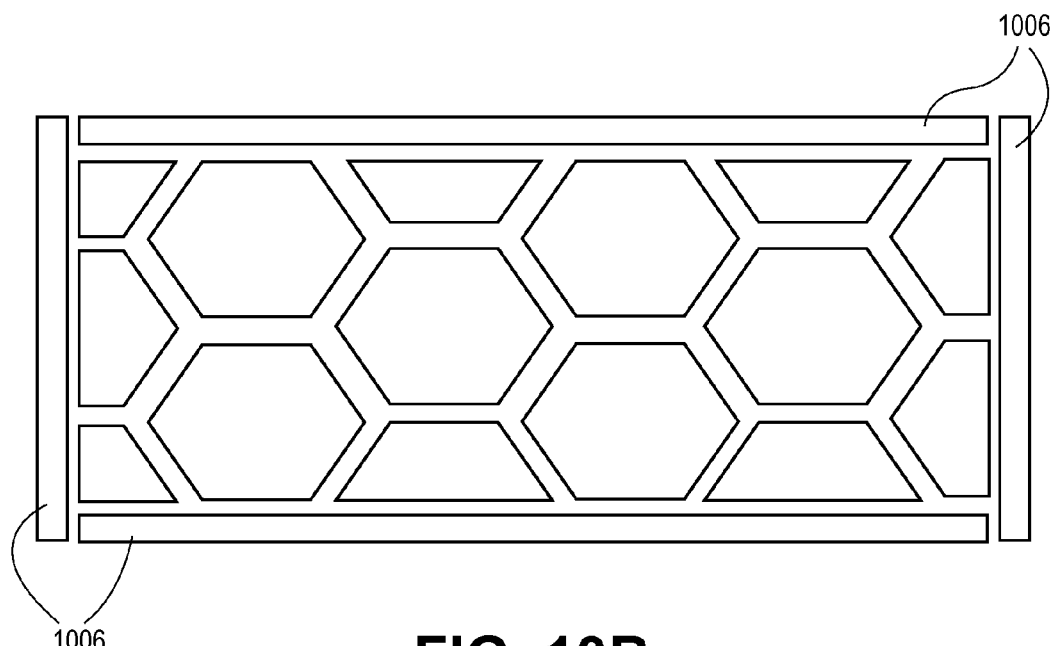

FIG. 10 depicts a further embodiment of the present invention in which stripes 1002 are arranged in a hexagonal configuration. Alternatively stated, openings 1004 are hexagonal in shape, as distinguished from rectangles or square openings of the previously described embodiments. In FIG. 10A stripes 1002 terminate in external openings 1004, as described previously, which result in LER. FIG. 10B shows open bar 1006, as described for previous embodiments, to reduce or eliminate the set back. It will be appreciated that any shape polygon may be used in accordance with the teachings of the present invention. It will be further appreciated that the present invention is not limited to rectilinear shapes, but also includes curvilinear shapes or combinations of curvilinear and rectilinear shapes.

Figure 10C:
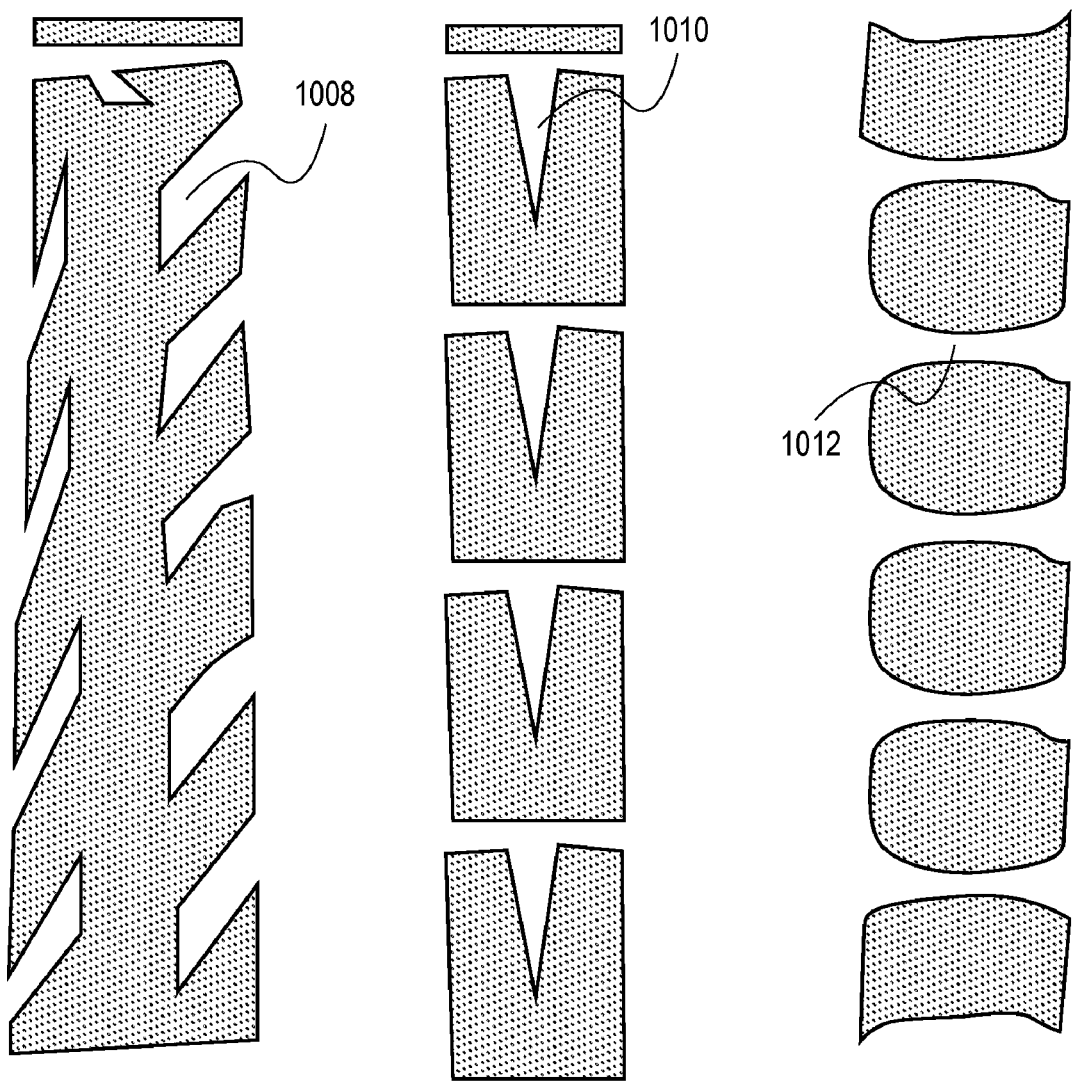

FIG. 10C depicts three alternative non-rectilinear blocking regions 1008, 1010, and 1012. The shaded portions represent open areas though which the charged particle beam may travel, and the white sections are blocking regions 1008, 1010, and 1012. One motivation for using for using such shielding areas is because when a charged particle beam hits the shield area, the stencil mask heats up. As the shielding area nears the edge of the character it is desired to have a wider or tapered shielding portion. This may require an augmentation "shot" to avoid a notch, the notch occurring from blocking by the shielding area, at the edge from being too big. This would, therefore, require two shots, but it may be very useful for writing lithography masks. The preceding description has been mostly based on rectilinear or polygonal openings and shapes. It will be appreciated that openings with many other shapes, rectilinear or curvilinear, may be used without deviating from the teachings of the present invention.

The present invention also includes embodiments of methods and machines for designing stencil masks used for writing onto a surface. FIG. 11A depicts a desired polygonal pattern 1102 from which a stencil mask will be designed. Polygonal pattern 1102 is loaded into memory of a computer system, and in this non-limiting example it has eight vertices. The polygonal pattern 1102 can be read from a variety of databases, which are well known to the skilled artisan. Observation points 1104 are then generated by dividing polygonal pattern 1102 into a grid, where observation points 1104 are placed at the intersections of the grid. The spacing of observation points 1104 can be variable or regular, polygonal or curvilinear configurations, and do not necessarily need to be in a rectilinear arrangement as depicted in the figure. The density of observation points 1104 can be made higher in areas where greater accuracy is desired or required. Deposition energy at each observation point 1104 is calculated. A closed-form formula for a rectangle example is well known to the skilled artisan, and polygonal patterns are fractured into a set of rectangles. Other methods of calculating the deposition area are also well known to the skilled artisan.

Figure 11B:
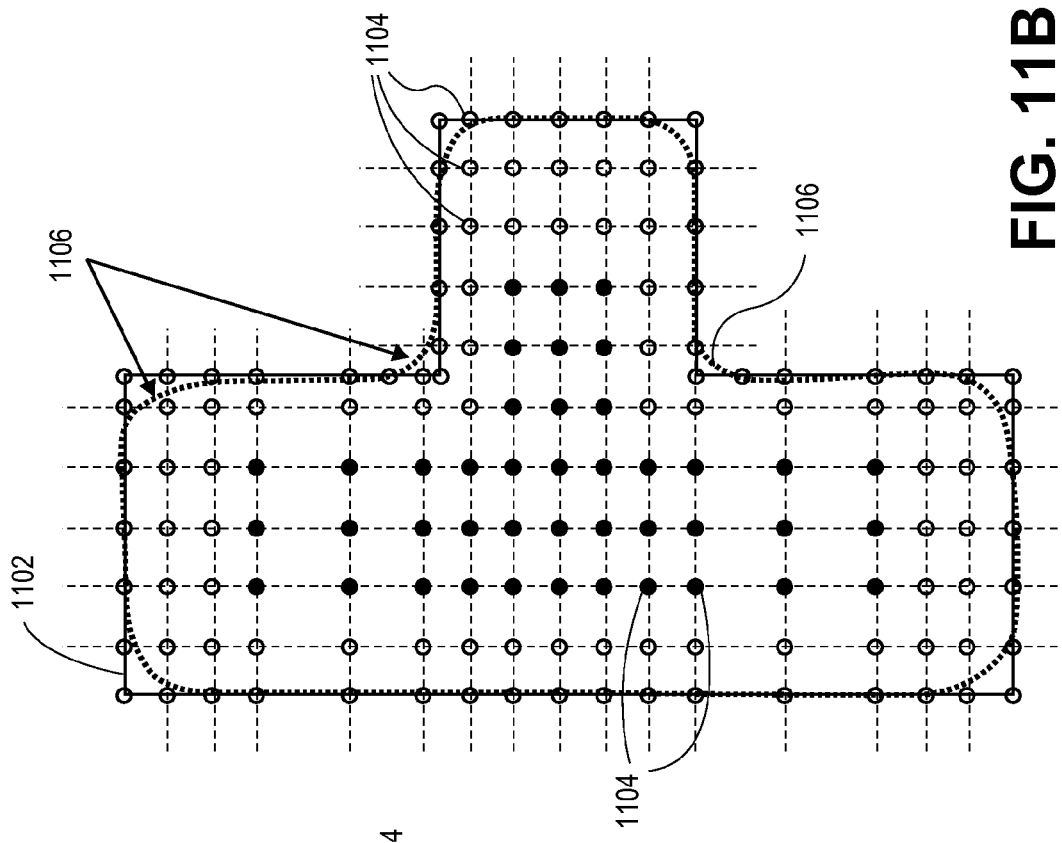
FIG. 11 depicts a method for designing a modified character shape for a stencil mask in accordance with embodiments of the present invention, it also depicts alternative curvilinear and rectilinear configurations for laying out blocking members.
Figure 11A:
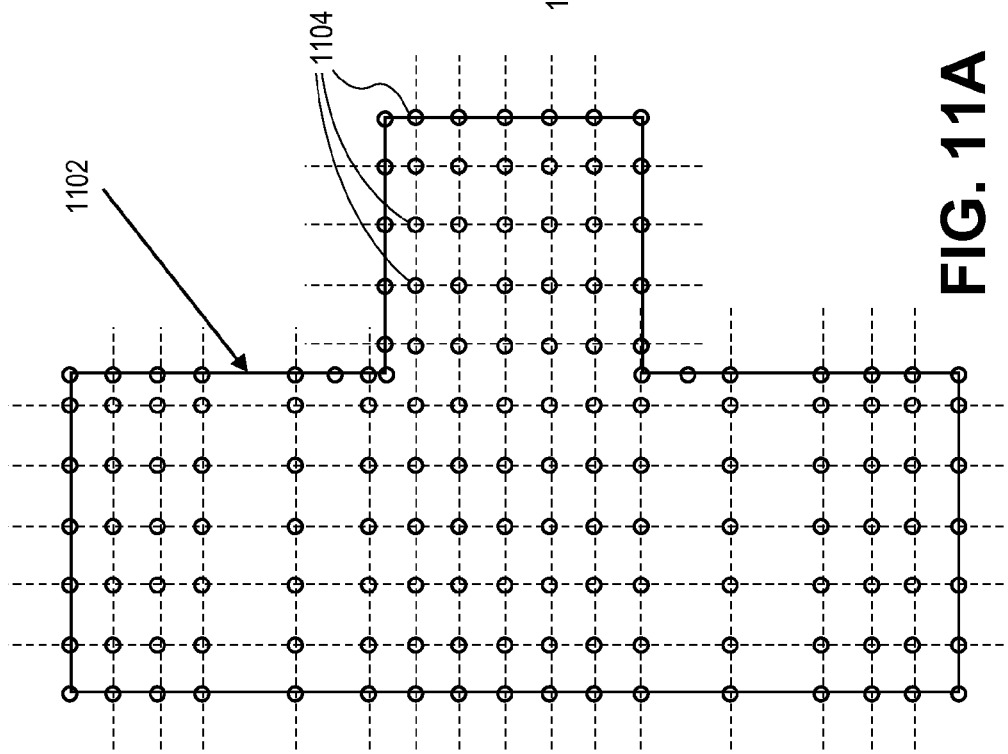

In FIG. 11B observation points 1104 having a deposition energy in excess of the threshold-energy are displayed using darkened circles. In particular, excess energy, as used herein, is the threshold energy plus some constant (K) amount of energy. It will be appreciated that the threshold energy is the energy at which a resist develops (either becomes soluble or insoluble to some solvent) after being exposed. The threshold energy is largely a physical property of the resist, and is also referred to herein as resist threshold energy or Eth, thus excess energy may be referred to as Eth+K. Latent image 1106 is then calculated. A latent image is a calculated image that would result from using a certain character shape; in FIG. 11B latent image 1106 is the calculated image that would result from a character or mask having the shape of polygonal pattern 1102. The skilled artisan will appreciate that factors other than the character shape are used to calculate the latent image, including but not limited to resist threshold energy and beam energy or intensity, backscattering, forward scattering and the like. It is noted that latent image 1106, illustrated as a dotted line, resulting from a character having the shape of polygonal pattern 1102 has low fidelity, rounded corners 1106, and, although not shown, also has excess energy deposition in the central regions of the polygon, which causes undesired Coulomb and proximity effects.

Figure 11D:
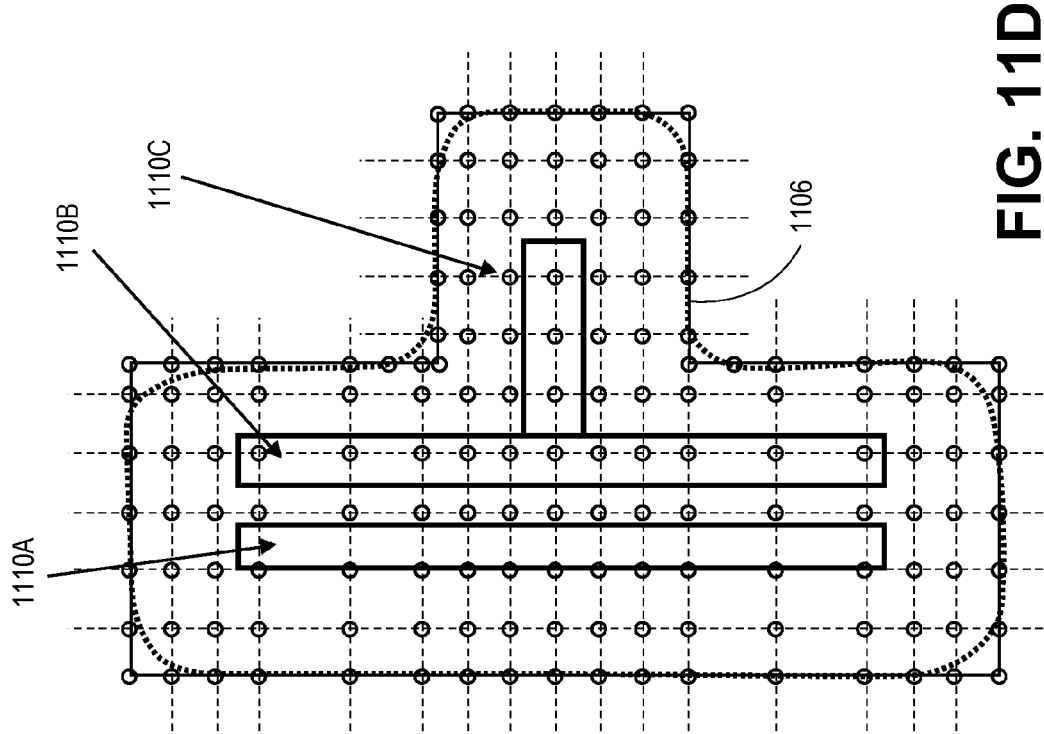
Figure 11C:
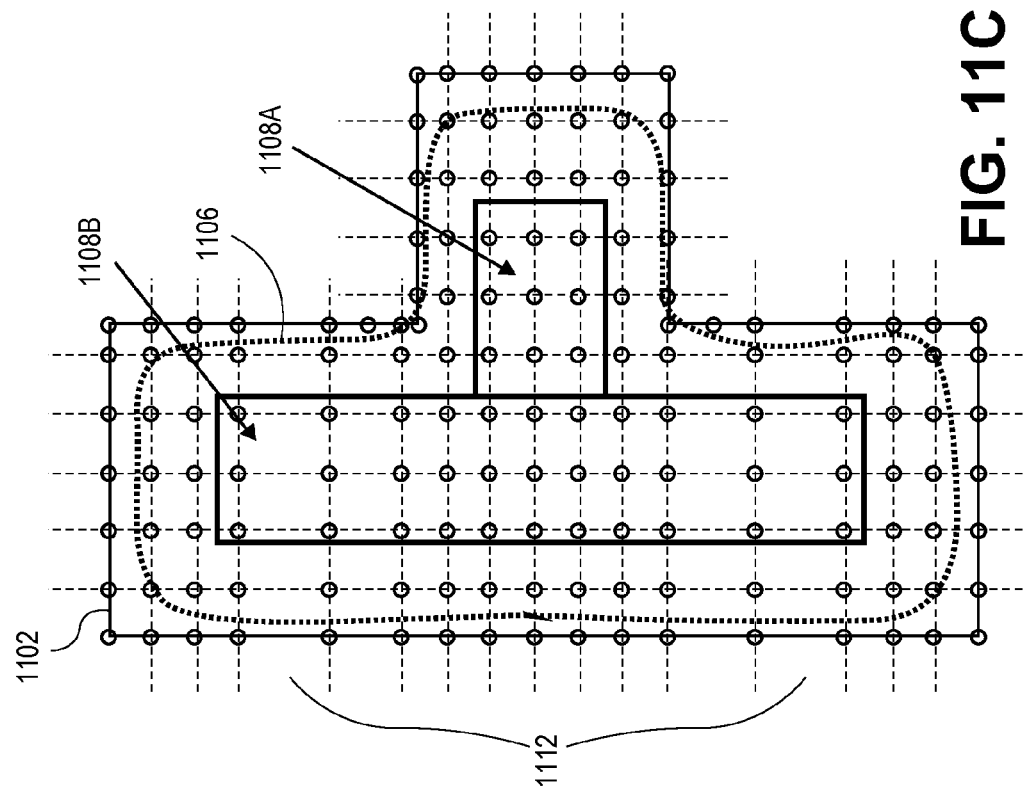

FIG. 11C depicts shielding patterns 1108A-B covering the regions having excess deposited energy. The excess energy regions, and, thus, shielding patterns are generated or calculated using a rule based approach. A rule based approach is well known to the skilled artisan. One exemplary example would be: (1) finding a region having excess energy; (2) calculating the total excess energy within that region; (3) generating an initial shielding pattern, the size and shape of which will be determined by the size and shape of the excess energy region. FIG. 11C shows examples of two shielding patterns 1108A-B for polygonal pattern 1102, being used in the current example. An excess energy calculation is performed again and a new set of shielding patterns is generated from the first shielding patterns (1108A-B, in this example) using a rule based or other calculation known to the skilled artisan. FIG. 11D depicts new shielding patterns 1110A-C. Shielding patterns 1110A-B result from and are smaller than shielding pattern 1108B; shielding pattern 1110C results from and is smaller than shielding pattern 1108A. The excess energy calculation done based on the first shielding patterns 1108A-B demonstrated that an insufficient amount of energy or dose reached the surface to fully expose the desired image; therefore, and as a result the shielding areas 1110A-C have a smaller area and increase the dose reaching the surface. Energy distribution calculations are redone for the new shielding patterns, and different shielding patterns are re-determined from these calculations until an adequate energy distribution is calculated. The adequate energy distribution is a quantity determined by the user.

Figure 11E:
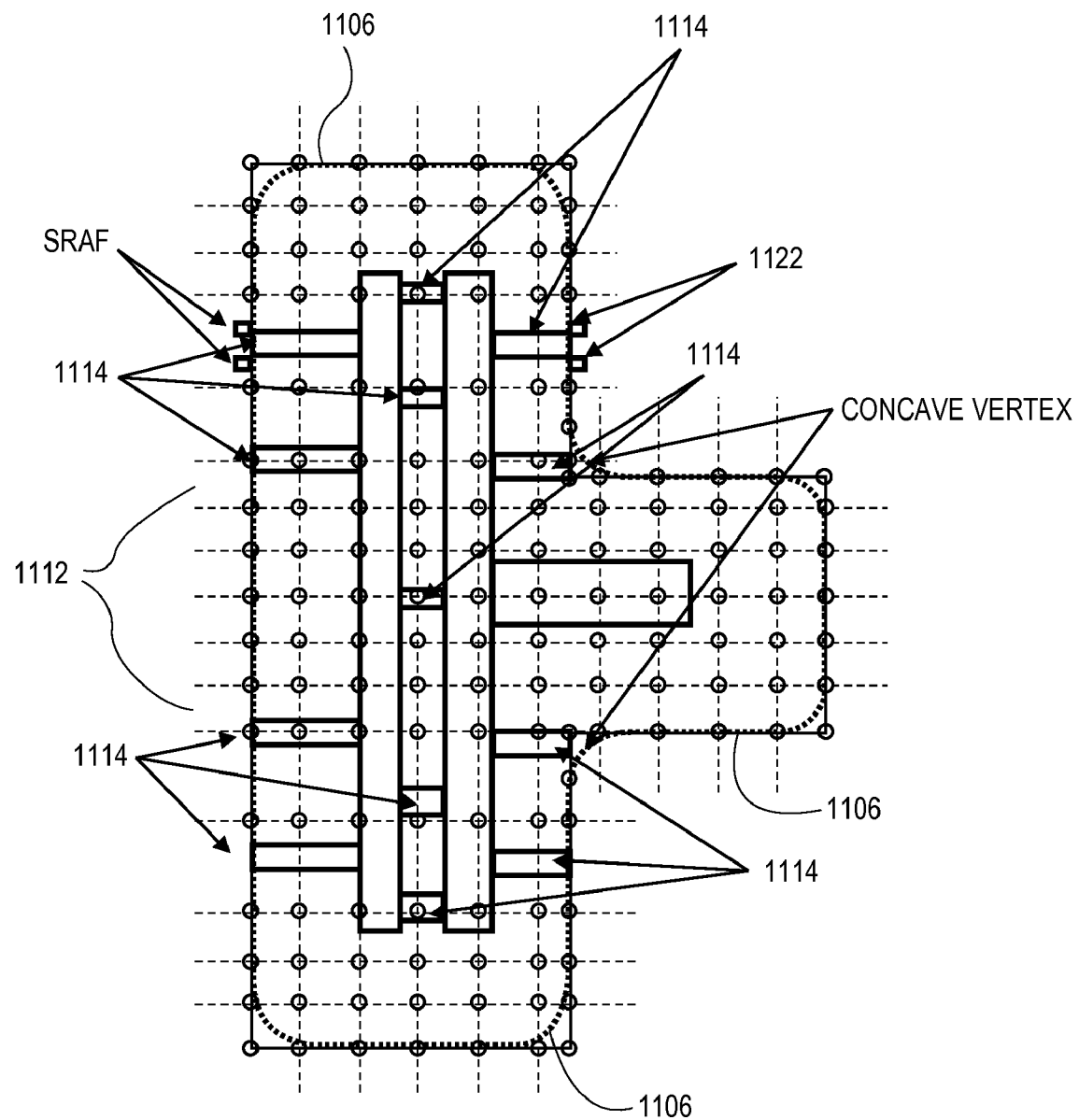
Figure 11F:
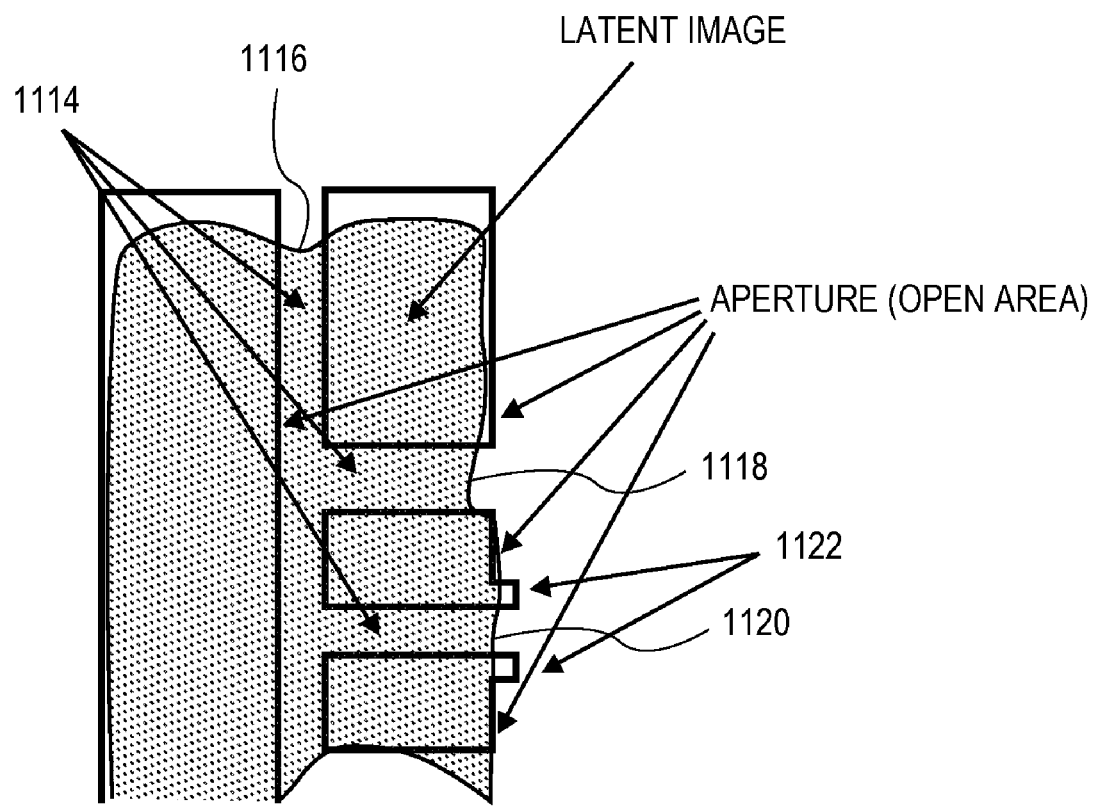
Figure 12B:
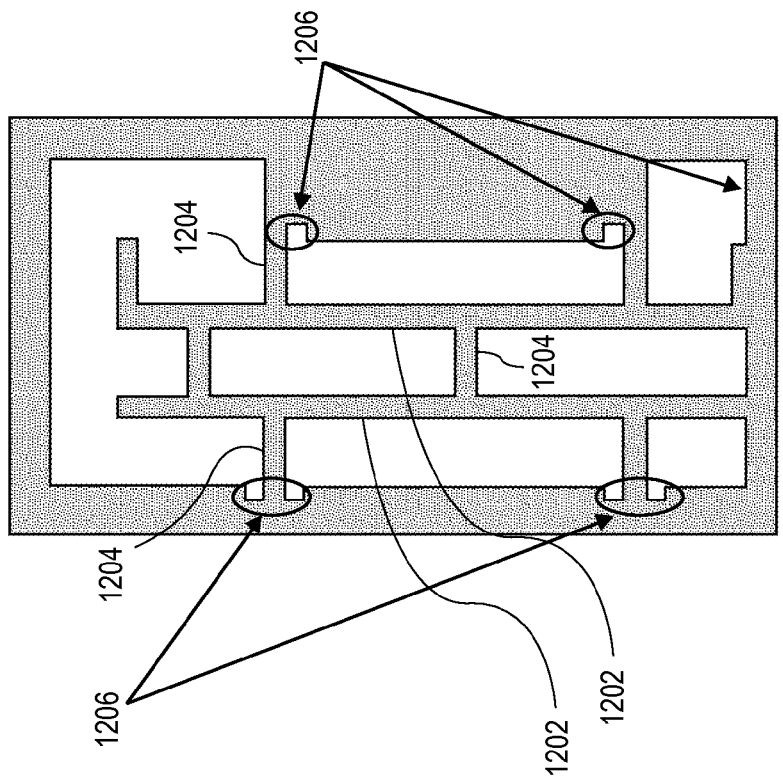
FIG. 12 depicts an example of the result of the method demonstrated in FIG. 11, in accordance with an embodiment of the present invention.
Figure 12A:
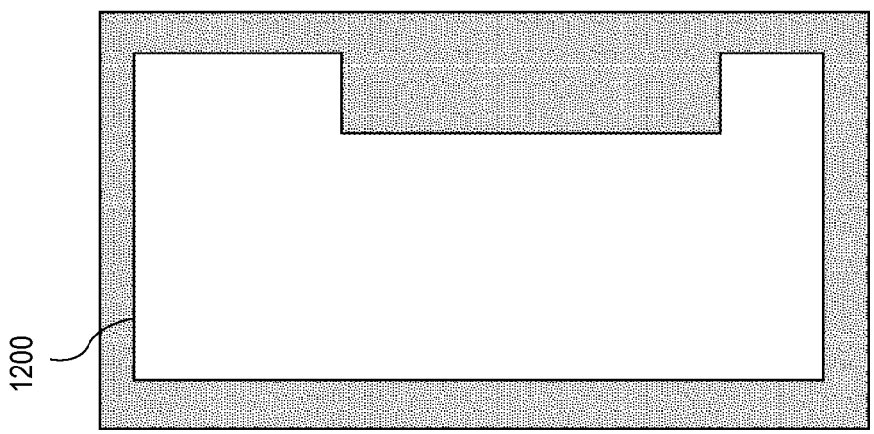
Figure 12D:
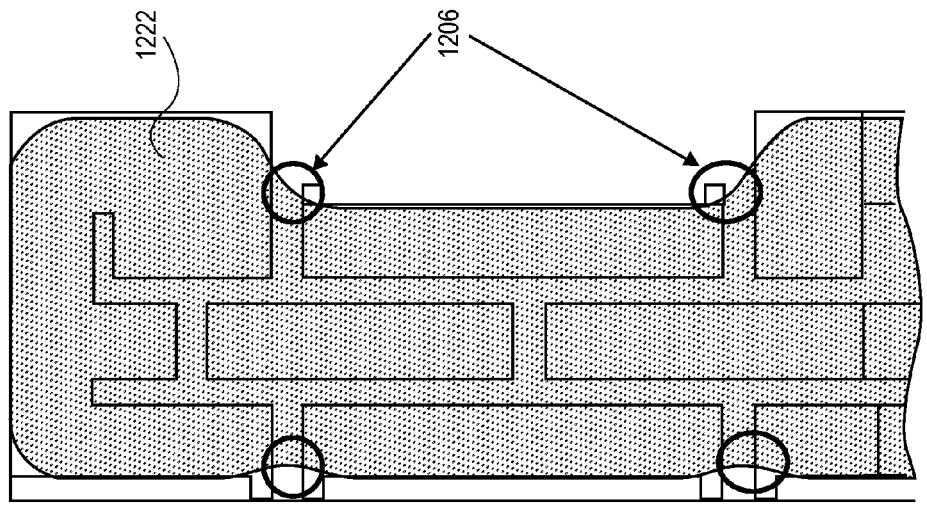
Figure 12C:
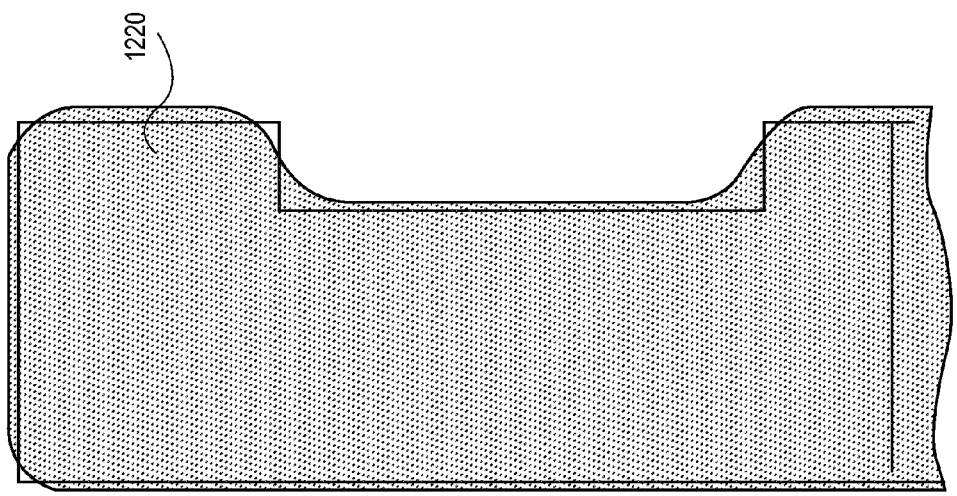

Referring again to FIG. 11C, the shielding patterns are not always supported or held in place by the stencil field 1112; sometimes they are free in space. FIG. 11E shows cross beams 1114 connecting shielding patterns 1110A-C to field 1112 of the stencil. Cross beams 1114 serve at least three purposes: (1) structural support for the shielding patterns; (2) heat dissipation from the shielding patterns to the field of the stencil; and (3) blocking additional radiation from reaching the surface. Given that the cross beams do block energy, the placement of them within the character is important. Based on an energy distribution calculation cross beams are placed within the character and the energy distribution calculation is repeated until the number size and location of the cross beams results in an adequate energy distribution. A latent image is calculated, a portion of which is shown in FIG. 11F, to determine the heuristics of cross beam placement. The latent image at point 1116 is not desirable because the sensitivity of the image to change in the character shape, as a result of the beam is too large, where the latent image is more acceptable at points 1118 and 1120. One mechanism of improving the fidelity at the points of cross-beam stencil intersection is the use of sub-resolution assist features 1122 or decorations. Referring back to FIG. 11E, sub-resolution assist features are strategically placed, cross beams 1114 are placed in accordance with the energy distribution calculations, the shape of the character is done and ready for manufacture. In addition to decorations, or other prior art mechanisms for improving the fidelity of an image can be used in combination with embodiments of the present invention. For example, and without limitation a sub-resolution mesh may be placed in front or behind the stencil or character.

At some point in the design of the character shape, the latent image obtained from a character shape needs to be "good enough." It will not be perfect because, at least in large part, the blocking members and cross-beams have reduced the amount of energy deposited or dose to the surface. This is referred to herein as equivalence or equivalence criteria. That is, the exact image on the surface (e.g., reticle, wafer substrate, or surface) is not obtained, but some equivalent image is obtained or calculated. The criteria for achieving an equivalent image that is "good enough" is the equivalence criteria. Additionally, if a reticle is being designed, a latent image on the reticle surface itself is determined and then a latent image that would result from using the reticle to image a second surface is calculated. Thus, unlike the prior art, the shape on the stencil is not exactly the desired shape, but rather something that has sufficient fidelity that will result in an image that also has sufficient fidelity. The present invention maintains sufficient fidelity, while reducing the overall dose, and, thus reducing Coulomb effects. Equivalence can also be as simple as a rule based approach.

FIG. 12 depicts another example of determining the shape of a character to increase the fidelity of the resulting image and reduce the amount of current going through the character, thereby reducing Coulomb and proximity effects. Shape 1200 (FIG. 12A) is loaded and the above referenced iteration is performed to determine placement of shielding patterns 1202 (FIG. 12B) and cross beams 1204 (FIG. 12B), and decorations 1206 are also placed in strategic areas. The white area represents open areas, through which the energy may pass. Several notes are made about this character shape (FIG. 12B): (1) there are no 4-way crossings; (2) crossbeam density at concave vertices is maximized; (3) there are decorations for improving the latent image; and (4) cross-beam at linear edges of the perimeter of the shape is minimized. The lines in FIG. 12D represent the shielding patterns and cross-beams of the character shape, and the grey areas represents the latent image 1222. The reduction in open area is preferably greater than approximately 20%, although the skilled artisan will understand that there is a great range of reduction percentage while still remaining within the scope of the present invention. FIGS. 12C-D depict the latent images achieved from the character with no change in shape (FIG. 12C element 1220) and that with a modified shape (FIG. 12D element 1222). It is noted that the latent image made with the character shape in accordance with embodiments of the present invention has a much higher fidelity than that achieved by a character having a conventional shape.

Figure 13:
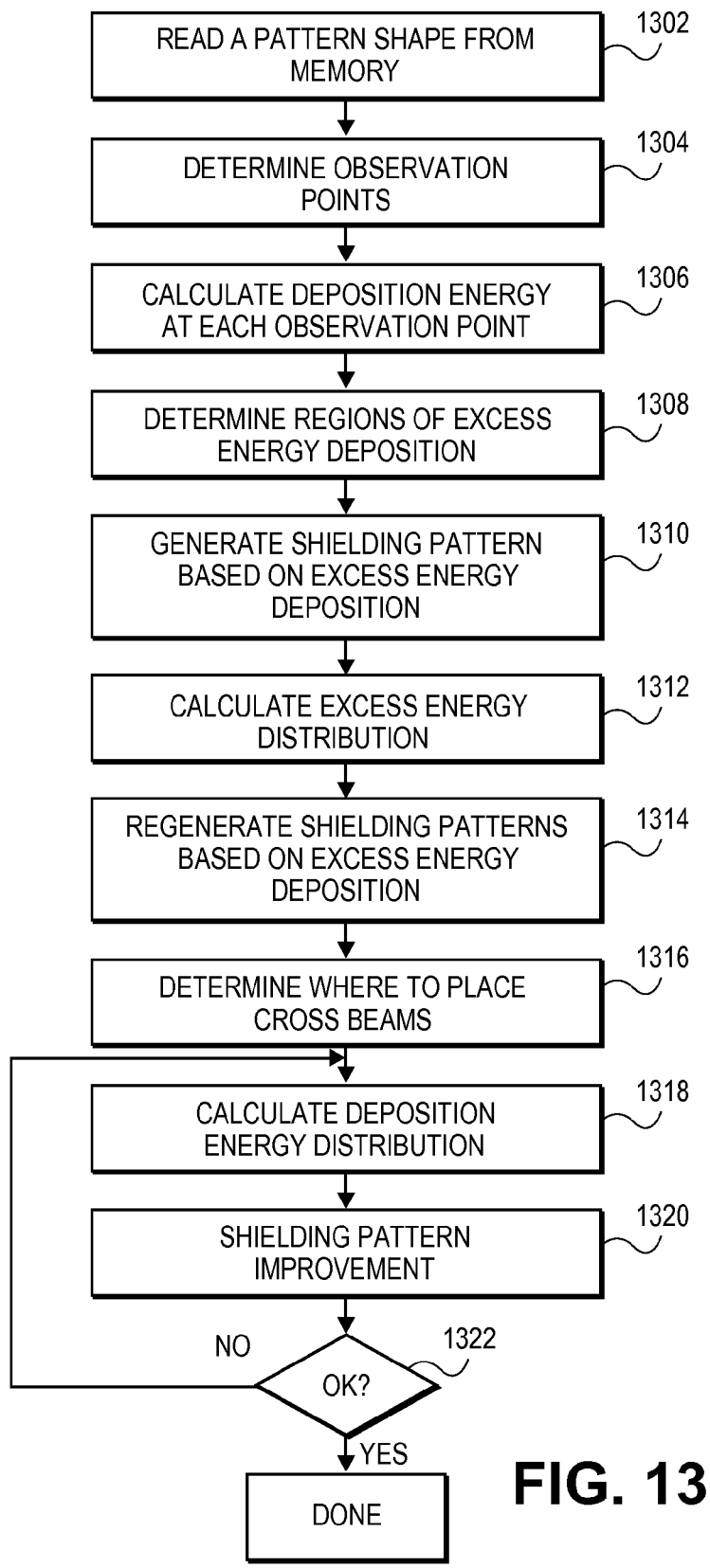
FIG. 13 depicts a method for designing a modified character shape for a stencil mask in accordance with an embodiment of the present invention.

FIG. 13 depicts a method for designing a stencil mask in accordance with an embodiment of the present invention. A pattern shape is read into memory in step 1302, from a cell library or database for example and without limitation. Observation points within the pattern shape are determined in step 1304. Deposition energy at each of the observation points is calculated in step 1306. Regions of excess energy deposition are determined in step 1308. Shielding patterns based on the excess energy deposition profile are generated in step 1310. An excess energy distribution is calculated in step 1312, and in step 1314 the shielding patterns are regenerated based on the new energy distribution. In step 1316 it is determined where to place cross-beams to hold shielding patterns in place and provide for heat dissipation. The deposition energy distribution is then calculated in step 1318, and in step 1320 the shielding pattern is improved, if necessary. If necessary step 1318 and 1320 are iterated until a satisfactory shape is achieved. Whether a satisfactory result has been achieved is determined by using equivalence criteria, as previously described.

It will be readily appreciated that the method described above with reference to FIG. 13 can be executed by a computer reading a computer readable medium having a software program thereon for executing the above described method. Thus, the computer and the computer readable medium practicing embodiments of the above referenced method are within the scope of the present invention.

Particular embodiments may be implemented by using a programmed general purpose digital computer, by using application-specific integrated circuits, programmable logic devices, field programmable gate arrays, or optical, chemical, biological, quantum or nano-engineered systems, components and mechanisms. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated particular embodiments, including what is described in the Abstract, is not intended to be exhaustive or to limit the invention to the precise forms disclosed herein. While specific particular embodiments of, and examples for, the invention are described herein for illustrative purposes only, various equivalent modifications are possible within the spirit and scope, as those skilled in the relevant art will recognize and appreciate. As indicated, these modifications may be made to the present invention in light of the foregoing description of illustrated particular embodiments and are to be included within the spirit and scope.

Thus, while the present invention has been described herein with reference to particular embodiments thereof, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit. It is intended that the invention not be limited to the particular terms used in following claims and/or to the particular embodiment disclosed as the best mode contemplated for carrying out this invention, but that the invention will include any and all particular embodiments and equivalents falling within the scope of the appended claims.

We claim:

1. A stencil mask for producing a desired image shape on a surface using particle beam lithography comprising:
   an aperture area comprising a plurality of open areas; and
   a shield area comprising an interstitial area between said plurality of open areas, wherein the union of the open areas and the shield area is approximately the desired image shape, and wherein the plurality of open areas, when exposed to a particle beam, is capable of projecting with one exposure shot the approximate desired image onto the surface, and wherein no more than three shield areas meet at any one apex of said plurality of open areas.

2. The stencil mask according to claim 1, wherein said plurality of open areas are polygons.

3. The stencil mask according to claim 1, wherein at least one of said plurality of open areas are tapered rectilinearly or curvilinearly towards an outer edge of said desired image shape.

4. The stencil mask according to claim 2, wherein an open area in the plurality of open areas is an open bar having an edge along the perimeter of the desired image shape.

5. A character for projecting a desired image onto a surface using a charged particle beam, the character being located in a stencil mask, the character comprising:
- a plurality of open areas; and
- one or more blocking members comprising an interstitial area between said open areas,
- wherein the union of the open areas and the area of the blocking members is approximately the desired image shape, wherein said blocking members reduce charged particle beam current passing through said character while permitting sufficient charged particle beam current through said character to project said desired image onto said surface, thereby reducing Coulomb and proximity effects, and wherein the plurality of open areas, when exposed to a particle beam, is capable of projecting with one exposure shot the approximate desired image onto the surface, and wherein no more than three blocking members meet at any one apex of said plurality of open areas.

6. The character according to claim 4, wherein said character approximately projects said desired image onto said surface in accordance to an equivalence criteria.

7. The character according to claim 6, wherein said surface is a reticle and said equivalence criteria accounts for an image said reticle will project onto a substrate.

8. The character according to claim 5, wherein said character further comprises at least one decoration on at least one apex of said shape to achieve a higher fidelity of said apex of the projected image.

9. The character according to claim 5, wherein said blocking members are stripes.

10. The character according to claim 7, wherein said stripes are laid out in an approximate polygonal configuration.

11. The character according to claim 10, wherein said polygonal configuration is a four-sided configuration having offset intersections.

12. The character according to claim 10, wherein said polygonal configuration is bounded by open bars, thereby providing sufficient beam energy where said stripes terminate within said shape.

13. A method of direct writing a desired image on a surface using a charged particle beam, the method comprising:
- providing a character in a stencil mask, the character comprising;
  - a plurality of open areas; and
  - one or more blocking members comprising an interstitial area between said plurality of open areas, wherein the union of the open areas and the area of the blocking members is approximately the desired image shape, and wherein no more than three blocking members meet at any one apex of said plurality of open areas; and
- passing said charged particle beam through said character, wherein said blocking members partially block current from said charged particle beam while permitting sufficient beam current through said plurality of open areas to project said desired image onto said surface in one exposure shot.

14. The method according to claim 13, wherein said blocking members are rectilinear.

15. The method according to claim 13, wherein said blocking members are curvilinear.

16. A method for designing a stencil mask for particle beam lithography comprising:
- a. loading a character shape, wherein a perimeter of said shape defines an outline for a desired pattern;
- b. defining a plurality of observation points within said desired pattern and along a boundary of said desired pattern;
- c. calculating a deposition energy at said observation points;
- d. determining one or more regions where said deposition energy exceeds a predefined energy value; and
- e. configuring shielding members for said one or more regions, wherein said shielding members reduce said deposition energy within and around said one or more regions, and wherein the union of the character shape and the shielding members is approximately the desired pattern.

17. The method according to claim 16, further comprising the steps of:
- v. calculating a theoretical latent image based on said character shape;
- vi. if said theoretical latent image does not have satisfactory fidelity, reconfiguring at least one shielding member; and
- vii. re-modifying said character shape to include the reconfigured shielding member to achieve a re-modified character shape.

18. The method according to claim 16, further comprising the steps of:
- f. defining at least one connecting member, wherein said at least one connecting member connects at least one shielding member of said shielding members to said perimeter of said character shape, provides structural support to said at least one shielding member, and blocks radiation from passing through said stencil mask;
- g. calculating a theoretical latent image based on said character shape, including the at least one shielding member and the at least one connecting member; and
- h. repeating steps f-g until the theoretical latent image has a pre-determined fidelity.

19. The method according to claim 16, wherein a rule based approach is used to determine shield members.

20. The method according to claim 18, further comprising the step of locating said at least one connecting member in proximity to a concave vertex.

21. The method according to claim 18, further comprising the step of placing decorations at one or more intersections of said at least one connecting member and the perimeter of said character shape.

* * * * *

UNITED STATES PATENT AND TRADEMARK OFFICE
CERTIFICATE OF CORRECTION

| | | |
|---|---|---|
| PATENT NO. | : 7,914,954 B2 | |
| APPLICATION NO. | : 12/207342 | |
| DATED | : March 29, 2011 | |
| INVENTOR(S) | : Fujimura et al. | |

It is certified that error appears in the above-identified patent and that said Letters Patent is hereby corrected as shown below:

In column 13, line 21, delete "claim 4" and insert --claim 5--.

Signed and Sealed this
Twenty-fourth Day of May, 2011

David J. Kappos
*Director of the United States Patent and Trademark Office*